United States Patent
Tanaka

(10) Patent No.: US 10,714,689 B2
(45) Date of Patent: Jul. 14, 2020

(54) FLEXIBLE OLED PANEL

(71) Applicant: Sharp Kabushiki Kaisha, Sakai, Osaka (JP)

(72) Inventor: Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/441,055

(22) Filed: Jun. 14, 2019

(65) Prior Publication Data

US 2019/0296237 A1 Sep. 26, 2019

Related U.S. Application Data

(63) Continuation of application No. 15/761,444, filed as application No. PCT/JP2017/007154 on Feb. 24, 2017, now Pat. No. 10,374,160.

(51) Int. Cl.

| H01L 51/00 | (2006.01) |
|---|---|
| H01L 51/56 | (2006.01) |
| H01L 27/32 | (2006.01) |
| H01L 51/52 | (2006.01) |
| G09F 9/30 | (2006.01) |
| H05B 33/02 | (2006.01) |
| H05B 33/04 | (2006.01) |
| H05B 33/10 | (2006.01) |

(52) U.S. Cl.
CPC .............. *H01L 51/003* (2013.01); *G09F 9/30* (2013.01); *H01L 27/32* (2013.01); *H01L 27/3258* (2013.01); *H01L 51/5253* (2013.01); *H01L 51/56* (2013.01); *H05B 33/02* (2013.01); *H05B 33/04* (2013.01); *H05B 33/10* (2013.01); *H01L 2227/323* (2013.01); *H01L 2227/326* (2013.01); *H01L 2251/566* (2013.01)

(58) Field of Classification Search
CPC ... H01L 27/3258; H01L 51/56; H01L 51/003; H01L 27/32; H01L 51/5253; H01L 2227/326; H01L 2227/323; H05B 33/02; H05B 33/10; H05B 33/04; G09F 9/30
See application file for complete search history.

(56) References Cited

U.S. PATENT DOCUMENTS

| 2002/0113929 A1* | 8/2002 | Yamazaki | ......... G02F 1/134363 349/123 |
|---|---|---|---|
| 2015/0155505 A1* | 6/2015 | Yamazaki | ......... H01L 29/78603 257/40 |

OTHER PUBLICATIONS

Tanaka, "Production Method for OLED Panel, and Production Apparatus For OLED Panel", U.S. Appl. No. 15/761,444, filed Mar. 20, 2018.

* cited by examiner

*Primary Examiner* — Laura M Menz
*Assistant Examiner* — Candice Chan
(74) *Attorney, Agent, or Firm* — Keating & Bennett, LLP

(57) ABSTRACT

A production method for an OLED panel includes forming on an upper face side of a transparent substrate, a layered body including a resin layer, a TFT layer, an OLED layer and a sealing layer including an organic sealing film, and then irradiating the resin layer being in contact with the transparent substrate with a laser beam to separate the transparent substrate and the layered body. In the production method, the resin layer includes a first region to be irradiated with a laser beam at a first intensity P1 and a second region to be irradiated with a laser beam at a second intensity P2 greater than the first intensity, the first region overlaps with the organic sealing film, and the second region does not overlap with the organic sealing film.

10 Claims, 11 Drawing Sheets

FLEXIBLE OLED PANEL

TECHNICAL FIELD

The disclosure relates to an OLED panel.

BACKGROUND ART

PTL 1 describes a method including forming on a transparent support substrate a layered body including an OLED layer, and then irradiating the layered body with a laser from the support substrate side to separate the support substrate and the layered body.

CITATION LIST

Patent Literature

PTL 1: JP 2015-195140 A (published on Nov. 5, 2015)

SUMMARY

Technical Problem

When a layered body is separated from a support substrate as described above, there is a problem such as generation of wrinkles or curls in the layered body.

Solution to Problem

According to one aspect of the disclosure, a production method for an OLED panel includes forming on an upper face side of a transparent substrate, a layered body including a resin layer, a TFT layer, an OLED layer and a sealing layer including an organic sealing film, and then irradiating the resin layer being in contact with the transparent substrate with a laser beam to separate the transparent substrate and the layered body. In the production method, the resin layer includes a first region to be irradiated with a laser beam at a first intensity and a second region to be irradiated with a laser beam at a second intensity greater than the first intensity, the first region overlaps with the organic sealing film, and the second region does not overlap with the organic sealing film.

Advantageous Effects of Disclosure

According to one aspect of the disclosure, it is possible to reduce a risk of generation of wrinkles or curls in the layered body separated from the transparent substrate.

DESCRIPTION OF EMBODIMENTS

Figure 1:
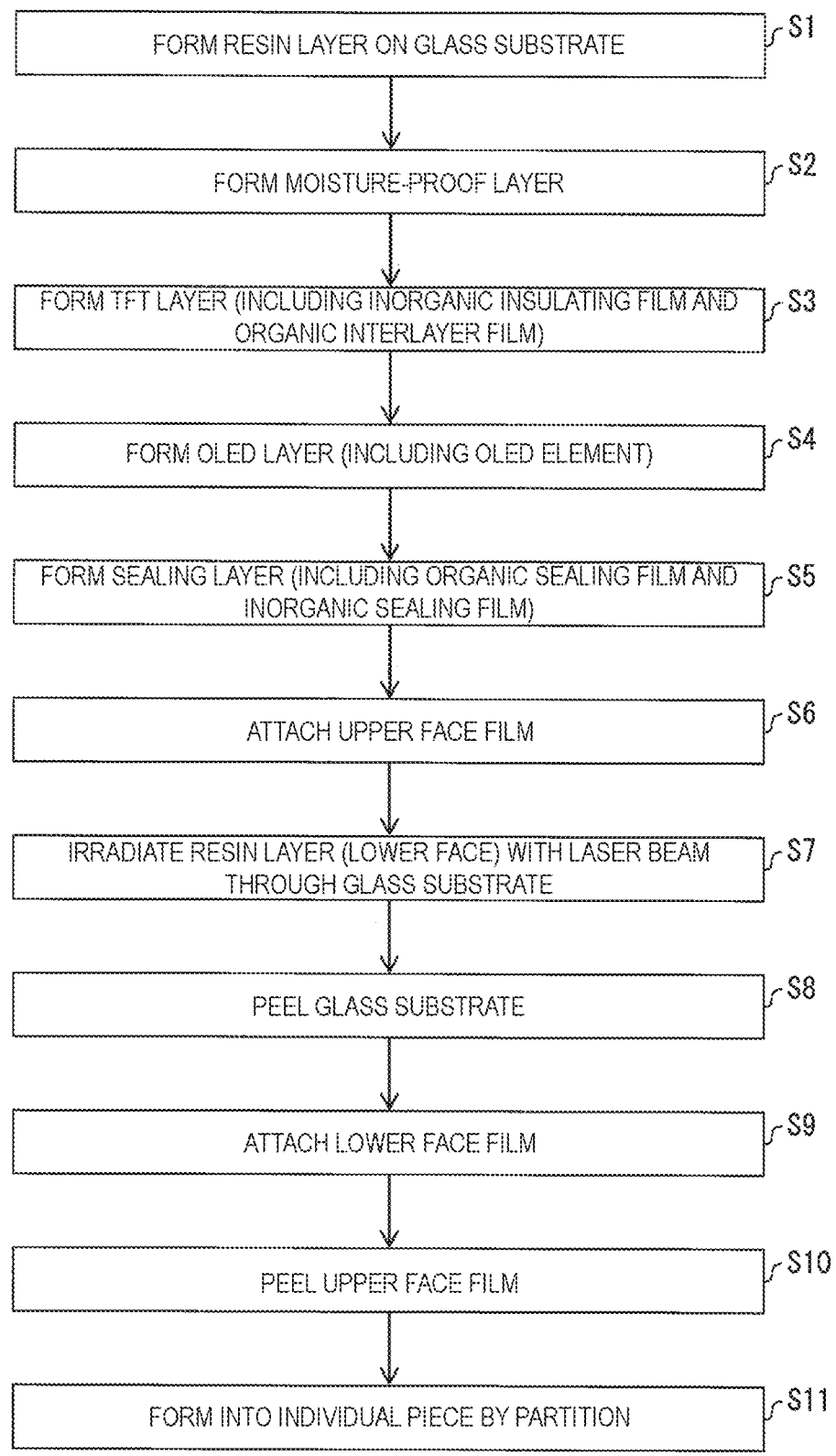
FIG. 1 is a flowchart illustrating an example of a production method for an OLED panel according to a first embodiment.
Figure 2A:
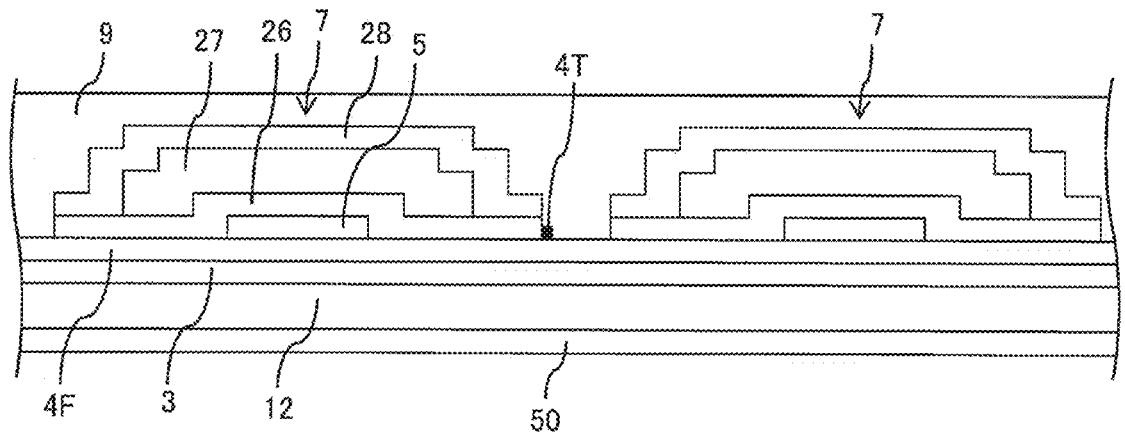
FIG. 2A is a cross-sectional view and FIG. 2B is a plan view illustrating a plurality of layered bodies formed on a glass substrate (mother glass).
Figure 2B:
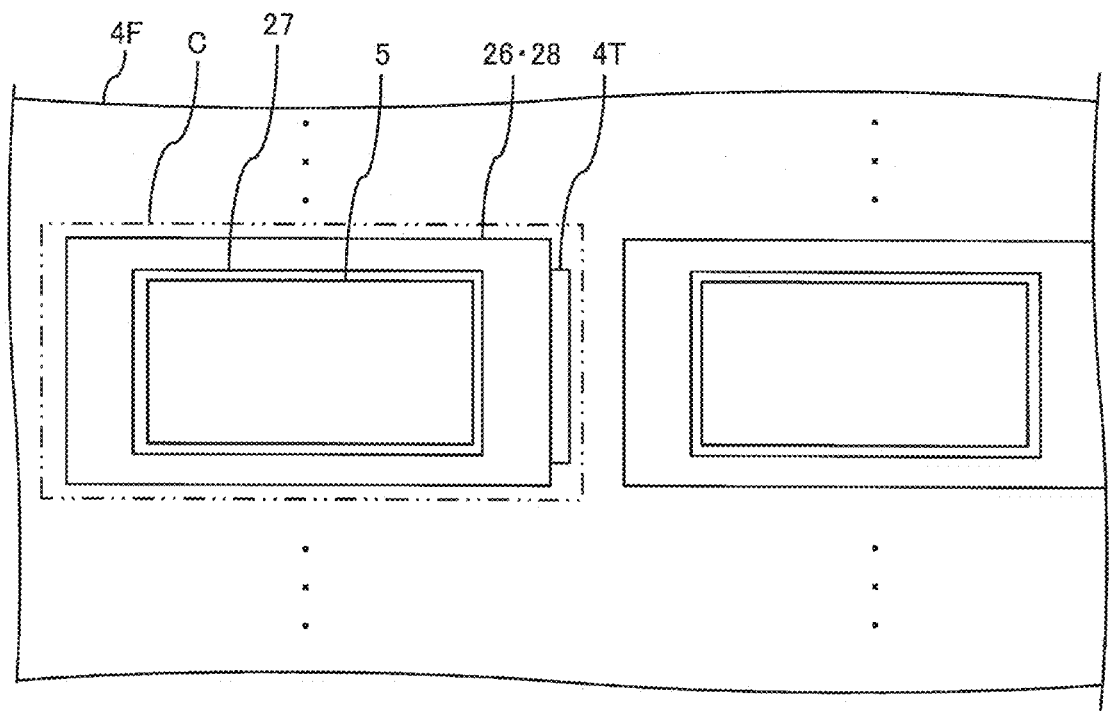
Figure 3A:
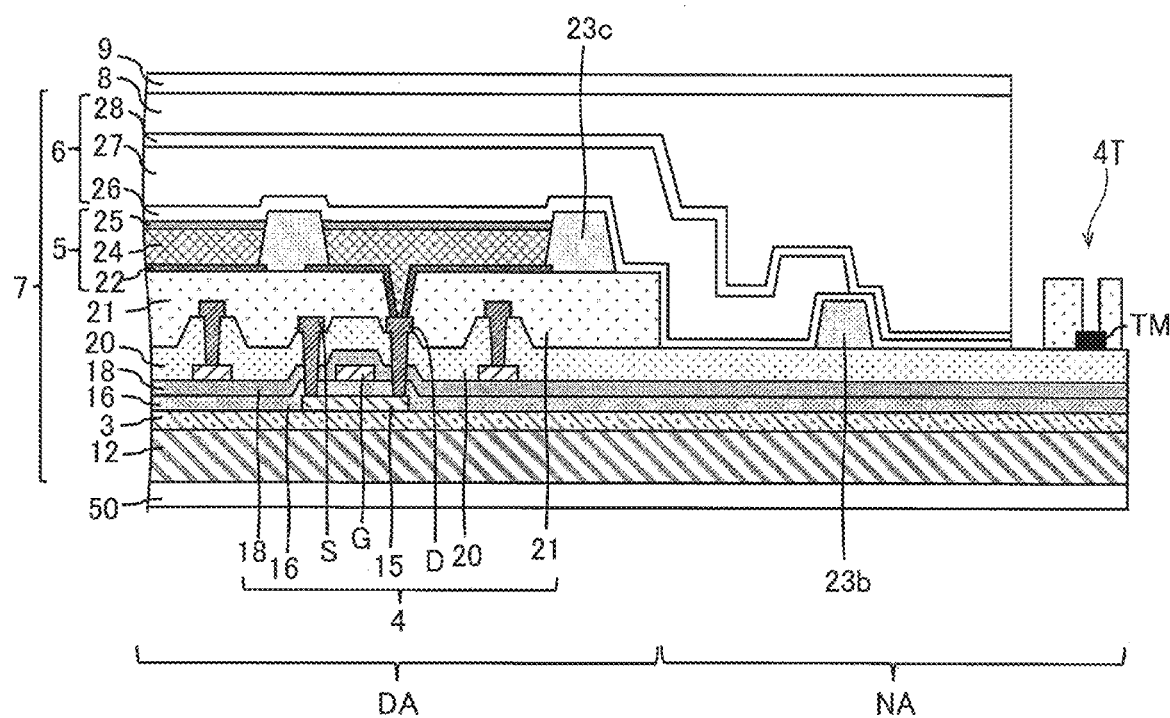
FIGS. 3A and 3B are cross-sectional views illustrating a configuration example of each layered body in FIGS. 2A and 2B.
Figure 3B:
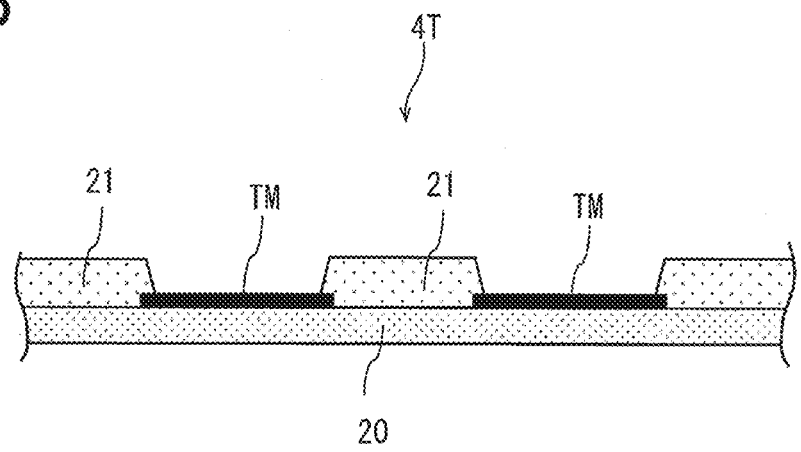

FIG. 1 is a flowchart illustrating an example of a production method for an OLED panel according to a first embodiment. FIG. 2A is a cross-sectional view and FIG. 2B is a plan view illustrating a plurality of layered bodies formed on a glass substrate that is mother glass respectively. FIGS. 3A and 3B are cross-sectional views illustrating the configuration example of each layered body.

As illustrated in FIGS. 1 to 3B, a resin layer 12 is first formed on a glass substrate 50 (transparent substrate) (step S1). Then, a moisture-proof layer 3 is formed (step S2). Then, a TFT layer 4 including inorganic insulating films 16, 18, 20 and an organic interlayer film 21 is formed (step S3). An inorganic insulating film 4F illustrated in FIGS. 2A and 2B includes at least one of the inorganic insulating films 16, 18, 20 illustrated in FIG. 3A. Then, an OLED layer 5 including an OLED element is formed (step S4). Then, a sealing layer 6 including a first inorganic sealing film 26, a second inorganic sealing film 28 and an organic sealing film 27 is formed into a plurality of layered bodies 7 (step S5). Then, an upper face film 9 is attached onto the plurality of layered bodies 7 via an adhesive layer 8 (step S6).

Then, a lower face of the resin layer 12 is irradiated with a laser beam through the glass substrate 50 (step S7). Here, the resin layer 12 absorbs the laser beam with which the lower face of the glass substrate 50 is irradiated and which passes through the glass substrate 50. As a result, the lower face of the resin layer 12 (interface with the glass substrate 50) is altered by abrasion, and bonding strength between the resin layer 12 and the glass substrate 50 decreases. As described below, in step S7, the resin layer 12 includes a first region to be irradiated with a laser beam at a first intensity and a second region to be irradiated with a laser beam at a second intensity greater than the first intensity. The first region overlaps with the organic sealing film 27, and the second region does not overlap with the organic sealing film 27.

Then, the glass substrate 50 is peeled from the layered body 7 (step S8). Then, a lower face film is attached to the layered body 7 (step S9). Then, the upper face film 9 is peeled from the plurality of layered bodies (step S10). Then, the glass substrate 50 on which the plurality of layered bodies 7 is formed is partitioned along a cut line C (see FIG. 2B) to obtain an OLED panel formed into an individual piece (step S11). Note that each of these steps is performed by a production apparatus for an OLED panel.

As illustrated in FIGS. 2A to 3B, the layered body 7 formed on the glass substrate 50 includes the resin layer 12, the moisture-proof layer 3 formed on an upper side of the resin layer 12, the TFT layer 4 formed on an upper side of the moisture-proof layer 3, the OLED layer 5 formed on an upper side of the TFT layer 4 and the sealing layer 6 formed on an upper side of the OLED layer 5, and the layered body 7 has flexibility.

Examples of the material used for forming the resin layer 12 include polyimide, polyethylene and polyamide. The resin layer 12 can be formed, for example, by dissolving these materials or precursors of these materials in a solvent to form liquid, and applying the liquid onto the glass substrate 50 by slit coating or spin coating to bake the layer. The thickness of the resin layer 12 is, for example, from 2 µm to 50 µm.

The moisture-proof layer 3 is a layer configured to prevent moisture or impurities from reaching the TFT layer 4 or the OLED layer 5, and the moisture-proof layer 3 can be composed of, for example, a silicon oxide film, a silicon nitride film or a silicon oxinitride film, or a layered bod film of these films, formed by a CVD. The thickness of the moisture-proof layer 3 is, for example, from 50 nm to 1500 nm.

The TFT layer 4 includes a semiconductor film 15, the inorganic insulating film 16 (gate insulating film) formed on an upper side of the semiconductor film 15, a gate electrode G formed on an upper side of the gate insulating film 16, the inorganic insulating films 18, 20 (passivation films) formed on an upper side of the gate electrode G, a source electrode S, a drain electrode D and a terminal TM formed on an upper side of the inorganic insulating film 20, and the organic interlayer film 21 formed on upper sides of the source electrode S and the drain electrode D. The semiconductor film 15, the inorganic insulating film 16, the gate electrode G, the inorganic insulating films 18, 20, the source electrode S and the drain electrode D constitute a Thin Film Transistor (TFT).

A plurality of the terminals TM used for external connection is formed on a terminal part 4T of the TFT layer 4. The terminals TM are electrically connected to, for example, the gate electrode G via routing wiring. The OLED element layer 5 and the sealing layer 6 are not formed on the terminal part 4T, but edges of the terminals TM are covered with the organic interlayer film 21.

The semiconductor film 15 is composed of a low-temperature polysilicon (LTPS) or an oxide semiconductor, for example. The gate insulating film 16 may include, for example, a silicon oxide (SiOx) film or a silicon nitride (SiNx) film, or a layered film of these films, formed by a CVD. The gate electrode G, the source electrode S, the drain electrode D and the terminals TM include a single-layer film or a layered film of a metal including at least one of aluminum (Al), tungsten (W), molybdenum (Mo), tantalum (Ta), chromium (Cr), titanium (Ti) and copper (Cu). Note that in FIGS. 2A and 2B, the TFT using the semiconductor film 15 as a channel is illustrated as a top-gate structure, but the TFT may have a bottom-gate structure (for example, when the channel of the TFT is an oxide semiconductor).

The inorganic insulating films 18, 20 can be composed of, for example, a silicon oxide (SiOx) film or silicon nitride (SiNx) film, or a layered film of these films, formed by a CVD. The organic interlayer film 21 can include a coatable photosensitive organic material such as polyamide and an acrylic. An anode electrode 22 is formed, for example, by layering of ITO (Indium Tin Oxide) and an alloy containing Ag, and is photoreflective.

The OLED layer 5 includes an anode electrode 22 formed on an upper side of the organic interlayer film 21, a partition 23c configured to define subpixels of a display region DC, a bank 23b formed in a non-display region NA, an organic EL (electroluminescence) layer 24 formed on an upper side of the anode electrode 22, and a cathode electrode 25 formed on an upper side of the organic EL layer 24.

The partition 23c and the bank 23b may be formed, for example, at the same step by using a coatable photosensitive organic material such as polyimide, epoxy and acrylic. The bank 23b of the non-display region NA is formed on the inorganic insulating film 20. The bank 23b defines an edge of the organic sealing film 27.

The organic EL layer 24 is formed by vapor deposition or an ink-jet method in a region (subpixel region) surrounded by the partition 23c. The organic EL layer 24 is formed by, for example, layering a hole injecting layer, a hole transport layer, a light emitting layer, an electron transport layer and an electron injecting layer in this order from the lower layer side. The cathode electrode 25 can include a transparent metal such as ITO (Indium Tin Oxide) and IZO (Indium Zinc Oxide).

In the OLED layer 5, holes and electrons are recombined in the organic EL layer 24 by a drive current between the anode electrode 22 and the cathode electrode 25, and the resulting excitons fall into a ground state and as a result, light is discharged.

The sealing layer 6 includes the first inorganic sealing film 26 covering the partition 23c and the cathode electrode 25, the organic sealing film 27 covering the first inorganic sealing film 26, and the second inorganic sealing film 28 covering the organic sealing film 27.

The first inorganic sealing film 26 and the second inorganic sealing film 28 can each be composed of, for example, a silicon oxide film, a silicon nitride film or a silicon oxinitride film, or a layered film of these films, formed by a CVD. The organic sealing film 27 is a transparent organic insulating film thicker than the first inorganic sealing film 26 and the second inorganic sealing film 28, and can be composed of a coatable photosensitive organic material such as polyamide and acrylic. For example, ink containing such an organic material is applied by an ink-jet method onto the first inorganic sealing film 26, and then is cured by UV irradiation. The sealing layer 6 covers the OLED layer 5, and prevents penetration of foreign matter such as water and oxygen into the OLED layer 5.

Note that the upper face film 9 is attached onto the sealing layer 6 via the adhesive layer 8, and functions as a supporting material when the glass substrate 50 is peeled. Examples of the material for the upper face film 9 include PET (polyethylene terephthalate), PEN (polyethylene naphthalate), COP (cycloolefin polymer), PI (polyimide), PC (polycarbonate), PE (polyethylene) and aramid.

The lower face film is attached to a lower face of the layered body 7 from which the glass substrate 50 is peeled, to produce an OLED panel with excellent flexibility. The lower face film is formed with a flexible resin material. Examples of such a resin material include PET (polyethylene terephthalate), PEN (polyethylene naphthalate), COP (cycloolefin polymer), PI (polyimide), PC (polycarbonate), PE (polyethylene) and aramid.

Figure 4A:
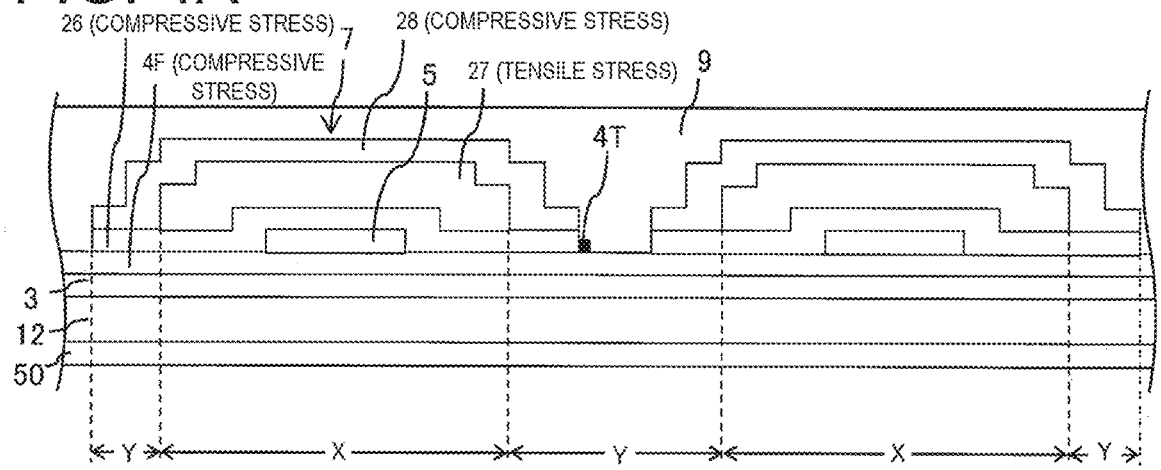
FIGS. 4A to 4C are schematic views illustrating irradiation of laser and peeling of the glass substrate according to the first embodiment.
Figure 4B:
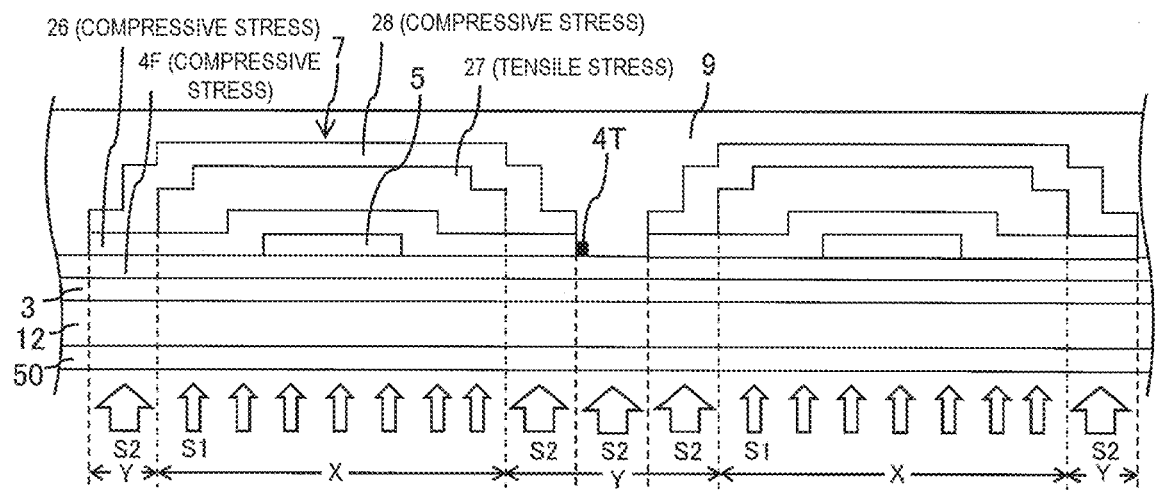
Figure 4C:
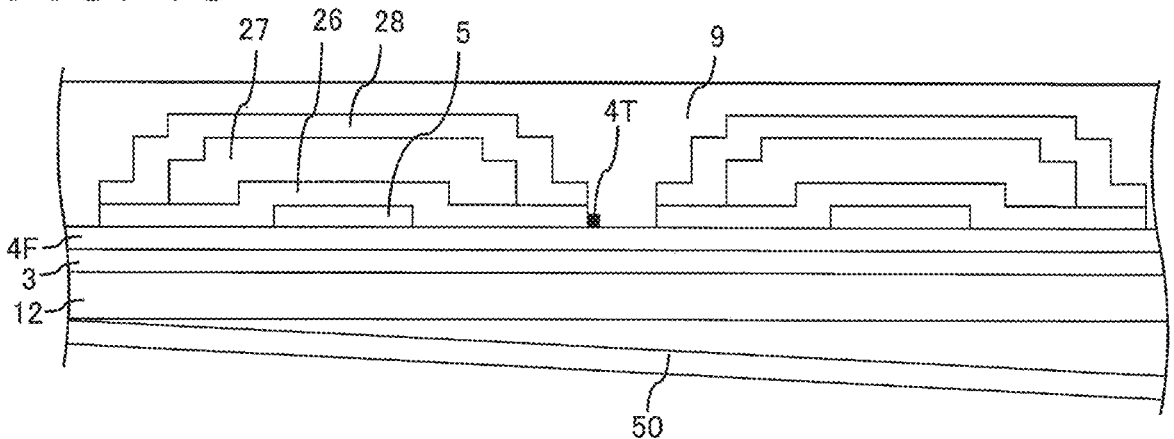

FIGS. 4A to 4C are schematic views illustrating the irradiation of the laser and the peeling of the glass substrate at steps S7 and S8 in FIG. 1.

A wavelength of the irradiation laser beam may be a wavelength at which the laser beam is absorbed by the resin layer 12 and alters the interface with the glass substrate 50. Therefore, when the material as described above is used as the resin layer 12, the wavelength of the laser beam is preferably not less than 300 nm and not greater than 355 nm, and is more preferably 308 nm, 343 nm or 355 nm.

Examples of the laser beam having such a wavelength include excimer laser (308 nm) and YAG laser (343 nm, 355 nm).

Here, wrinkles or curls may be generated in the layered body 7 separated from the glass substrate 50 owing to stress generated in each film of the layered body 7 prior to separation.

This stress includes compressive stress (unit: Pascals) that is force in response to external force in a direction in which a film is compressed, and tensile stress (unit: Pascals) that is force in response to external force in a direction in which a film is pulled. Generally, compressive stress is expressed by a negative value, and tensile stress is expressed by a positive value.

A film having compressive stress expands when external force is eliminated (when compressive stress is released), and a film having tensile stress contracts when external force is eliminated (when tensile stress is released). Stress generated at the time of film formation is determined by a material for film formation, the film formation conditions, and the substrate for film formation.

In the layered body 7 illustrated in FIG. 4A, in particular, compressive stress is generated in the inorganic insulating film 4F of the TFT layer 4 and in the first inorganic sealing film 26 and the second inorganic sealing film 28 of the sealing layer 6. That is, large compressive stress (−) is generated at locations where the inorganic insulating film 4F overlaps with the first inorganic sealing film 26 and the second inorganic sealing film 28. On the other hand, tensile stress (+) is generated in the organic sealing film 27 that shrinks and cures by UV irradiation. In an inner portion of the layered body 7 (including a display part on which the OLED layer 5 is formed), since the organic sealing film 27 is formed, even when the glass substrate 50 is peeled, the compressive stress (−) in the inorganic films (the inorganic insulating film F, the first inorganic sealing film 26 and the second inorganic sealing film 28) and the tensile stress (+) in the organic sealing film 27 negate each other, and these wrinkles or curls are unlikely to be generated.

However, since the organic sealing film 27 is not formed in an outer peripheral portion, the compressive stress in the inorganic films (in particular, the inorganic insulating film F, the first inorganic sealing film 26 and the second inorganic sealing film 28) is not negated, and when the compressive stress in the inorganic films is released owing to the peeling of the glass substrate 50, the outer peripheral portion expands, and wrinkles or curls are generated. When wrinkles or curls are generated in the layered body 7, subsequent attachment or transport of the flexible film becomes difficult, and there is a problem of reduction in production efficiency of the OLED panel.

First Embodiment

Figure 5:
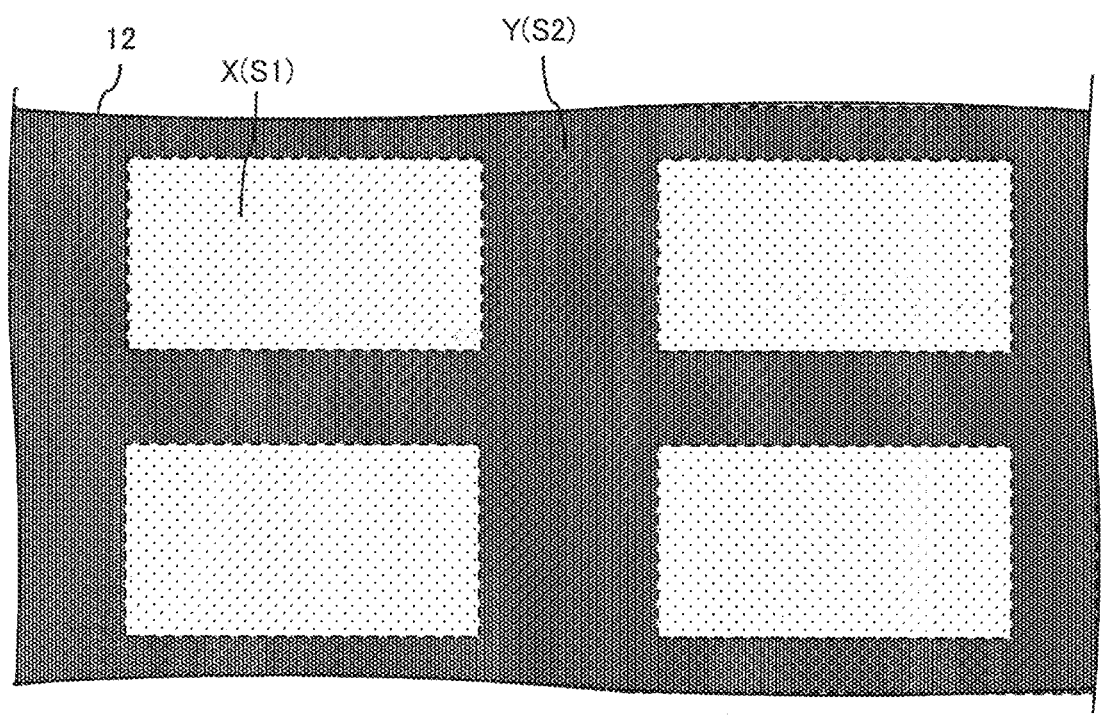
FIG. 5 is a plan view illustrating an intensity of a laser beam for each region according to the first embodiment.

FIGS. 4A to 4C are schematic views illustrating irradiation of laser and peeling of a glass substrate according to a first embodiment, and FIG. 5 is a plan view illustrating an intensity of a laser beam for each region according to the first embodiment.

In the first embodiment, as illustrated in FIGS. 4A and 5, a region X of a resin layer 12 (region in which the resin layer 12 and the organic sealing film 27 overlap with each other) is set as a first region to be irradiated with a laser beam at an intensity S1, and a region Y of the resin layer 12 (region in which the resin layer 12 and the organic sealing film 27 do not overlap with each other) is set as a second region to be irradiated with a laser beam at an intensity S2 (>S1). The intensities S1 and S2 of the laser beams are measured by the amount of joules per unit area, for example.

Thus, as illustrated in FIG. 4B, after irradiation with the laser beam, stress does not change (0→0) in the region X of the resin layer 12, and a large tensile stress (+) is generated by the laser beam at the intensity S2 in the region Y of the resin layer 12. Therefore, the compressive stress (−) in the inorganic insulating film 4F, the first inorganic sealing film 26 and the second inorganic sealing film 28 released at the time of peeling of a glass substrate 50 illustrated in FIG. 4C is negated by the tensile stress (+) in the region Y of the resin layer 12, and wrinkles or curls that may be generated in a layered body 7 can be reduced. Note that laser abrasion marks may be formed in at least a portion of the region Y of the resin layer 12.

Since an intensity of a laser beam of pulse laser such as excimer laser and YAG laser is determined by output of the laser beam, the intensity of the laser beam can be changed by changing the output of the laser beam to vary energy density (mJ/cm$^2$).

The intensity S1 of the laser beam is set to a magnitude at which adhesive force between the glass substrate 50 and the resin layer 12 reduces to a value at which the glass substrate 50 can be peeled at a subsequent step, and the intensity S2 of the laser beam is set to a magnitude at which tensile stress corresponding to the compressive stress in the inorganic insulating film 4F, the first inorganic sealing film 26 and the second inorganic sealing film 28 is applied to the resin layer 12.

A ratio of the intensity S2 of the laser beam to the intensity S1 of the laser beam is from 1.2 to 2.2, for example. When the intensity S1 of the laser beam is 100 mJ/cm$^2$, the intensity S2 of the laser beam is not less than 150 mJ/cm$^2$ and not greater than 200 mJ/cm$^2$.

Second Embodiment

Figure 6A:
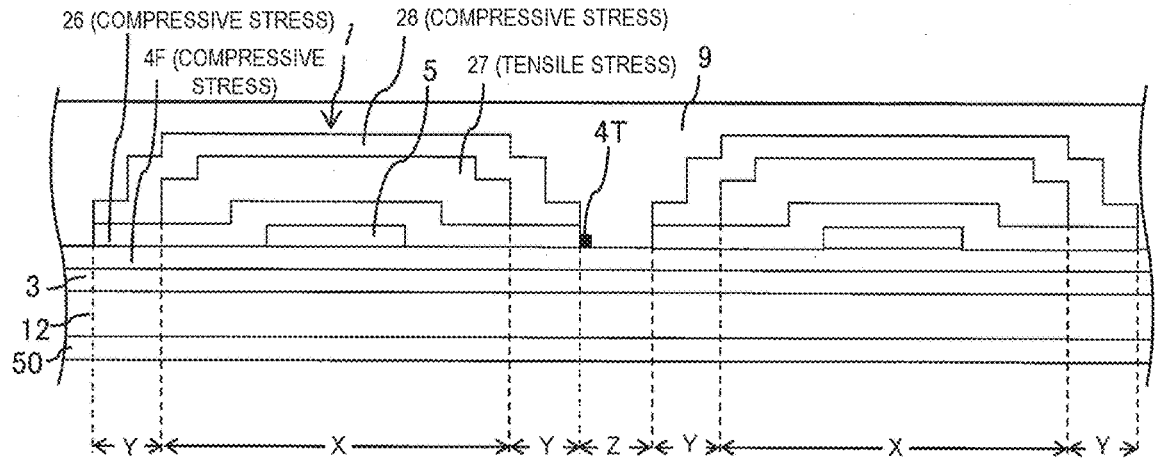
FIGS. 6A to 6C are schematic views illustrating irradiation of laser and peeling of a glass substrate according to a second embodiment.
Figure 6B:
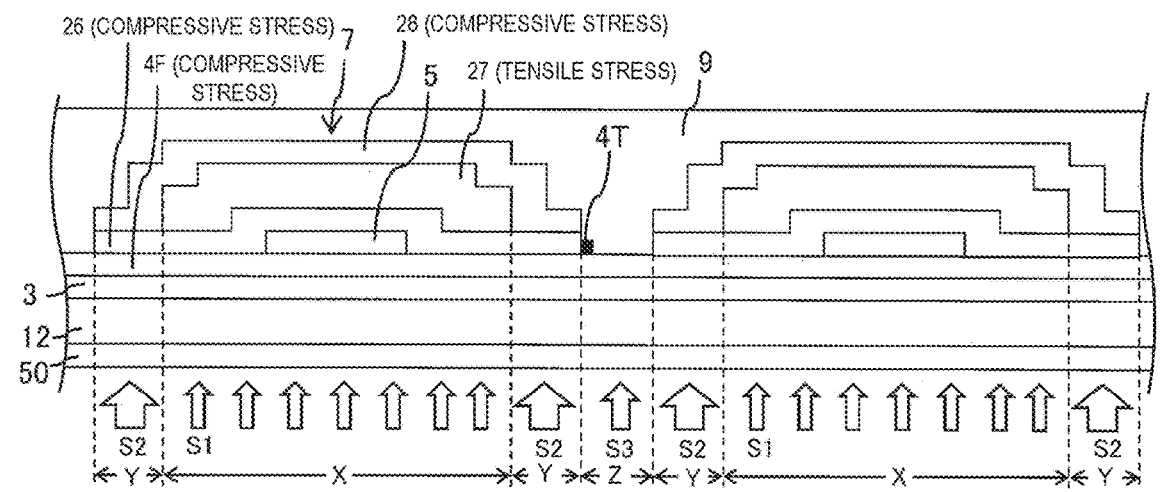
Figure 6C:
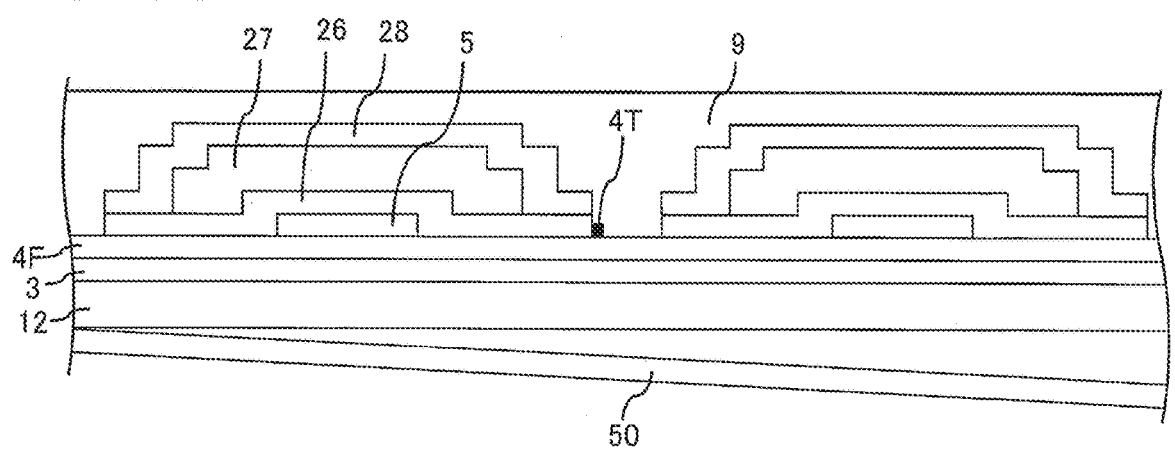
Figure 7:
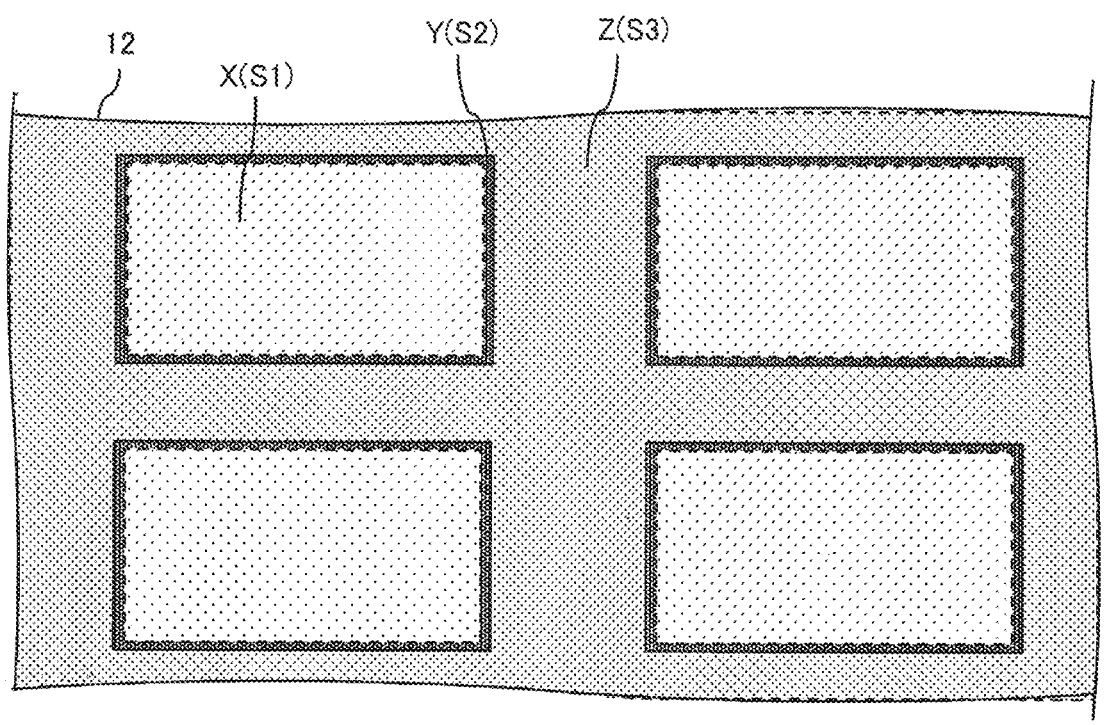
FIG. 7 is a plan view illustrating an intensity of a laser beam for each region according to the second embodiment.

FIGS. 6A to 6C are schematic views illustrating irradiation of laser and peeling of a glass substrate according to a second embodiment, and FIG. 7 is a plan view illustrating an intensity of a laser beam for each region according to the second embodiment.

In the second embodiment, as illustrated in FIGS. 6A, 7, a region X of a resin layer 12 (region in which the resin layer 12 overlaps with the organic sealing film 27, the inorganic insulating film 4F of the TFT layer 4, the first inorganic sealing film 26, and the second inorganic sealing film 28) is set as a first region to be irradiated with a laser beam at an intensity S1; a region Y of the resin layer 12 (region in which the resin layer 12 and the organic sealing film 27 do not overlap with each other, but the resin layer 12 overlaps with the inorganic insulating film 4F of the TFT layer 4, the first inorganic sealing film 26 and the second inorganic sealing film 28) is set as a second region to be irradiated with a laser beam at an intensity S2; and a region Z of the resin layer 12 (region in which the resin layer 12 does not overlap with the organic sealing film 27, the first inorganic sealing film 26 and the second inorganic sealing film 28, but the resin layer 12 and the inorganic insulating film 4F of the TFT layer 4 overlap with each other) is set as a third region to be irradiated with a laser beam at an intensity S3. Here, a relationship of the intensity S1<the intensity S3<the intensity S2 holds.

Thus, as illustrated in FIG. 6B, after irradiation with the laser beam, stress does not change (0→0) in the region X of the resin layer 12; a large tensile stress (+) is generated by the laser beam at the intensity S2 in the region Y of the resin layer 12; and a moderate tensile stress (+) is generated by the laser beam at the intensity S3 in the region Z of the resin layer 12. Therefore, compressive stress (−) in the inorganic insulating film 4F, the first inorganic sealing film 26 and the second inorganic sealing film 28 released at the time of peeling of a glass substrate 50 illustrated in FIG. 6C is negated by the tensile stress (+) in the regions Y, Z of the resin layer 12, and wrinkles or curls that may be generated in a layered body 7 can be reduced. Note that laser abrasion marks may be formed in at least a portion of the region Y of the resin layer 12 (described below).

Figure 8A:
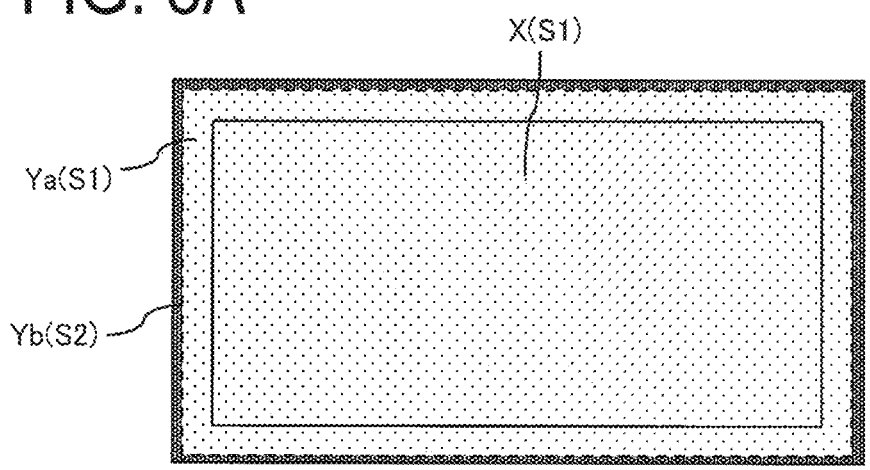
FIGS. 8A to 8B are plan views illustrating a variation of the second embodiment.
Figure 8B:
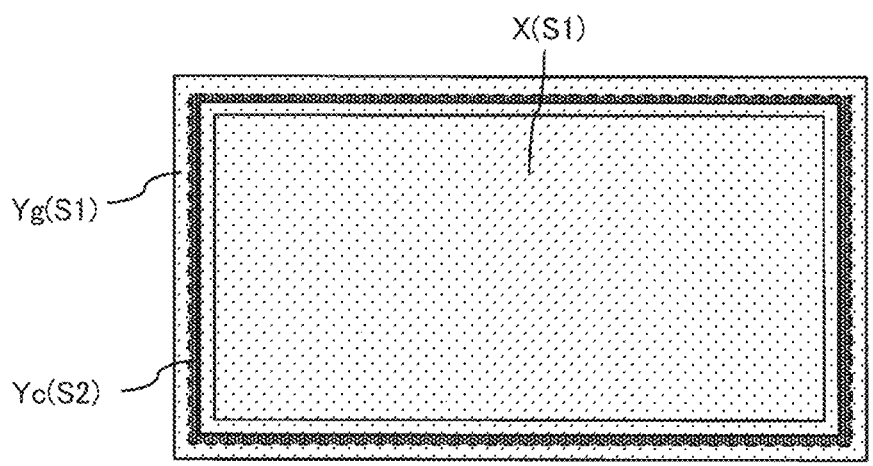

Note that in FIG. 7, the region Y of the resin layer 12 is entirely set as the second region to be irradiated with a laser beam at the intensity S2, but the embodiment is not limited to this case. As illustrated in FIG. 8A, an inner region Ya of the region Y can be irradiated with a laser beam at the intensity S1, and an outer region Yb of the region Y can be irradiated with a laser beam at the intensity S2. Moreover, as illustrated in FIG. 8B, a central region Yc of the region Y can be irradiated with a laser beam at the intensity S2, and other regions (regions on both sides of the central region Yc) Yg can be irradiated with a laser beam at the intensity S1.

Third Embodiment

Figure 9A:
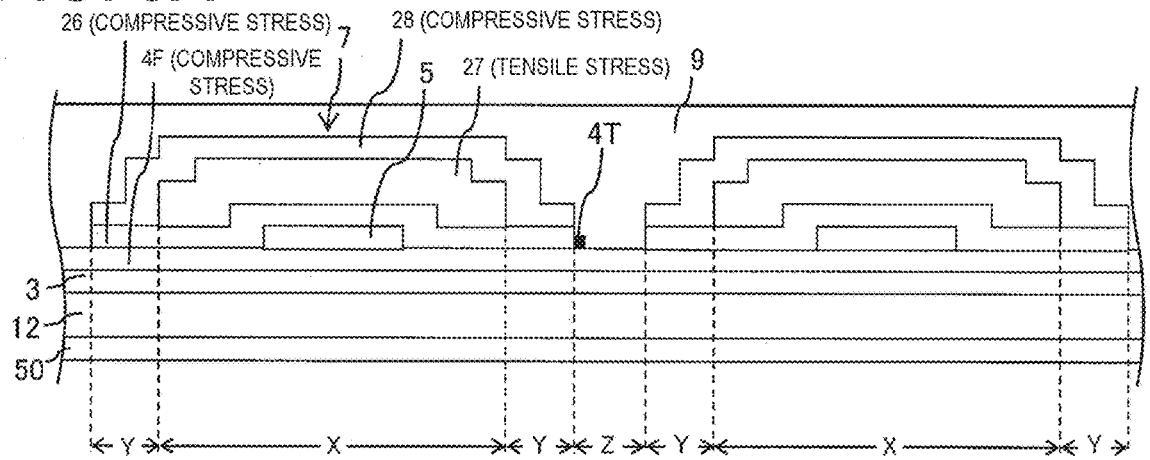
FIGS. 9A to 9C are schematic views illustrating irradiation of laser and peeling of a glass substrate according to a third embodiment.
Figure 9B:
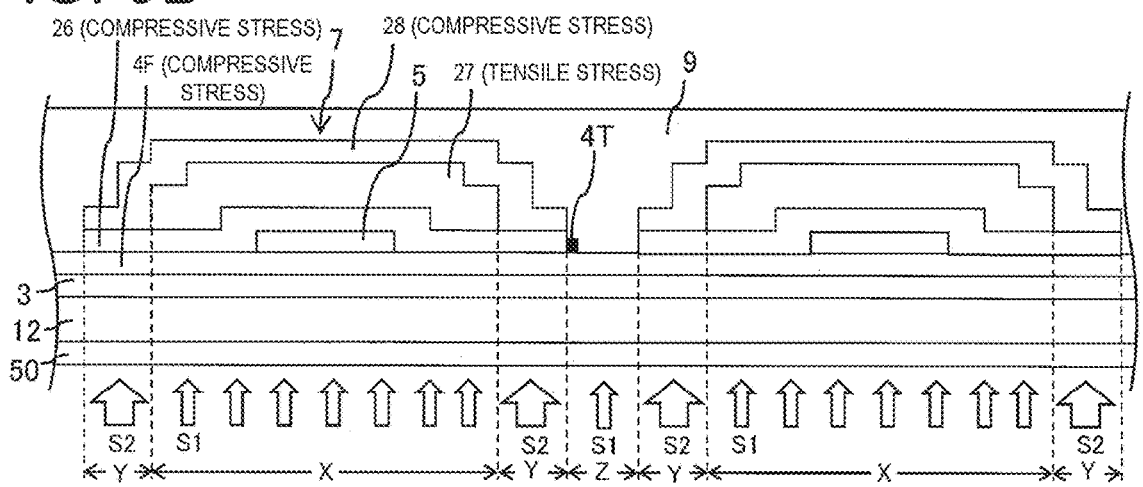
Figure 9C:
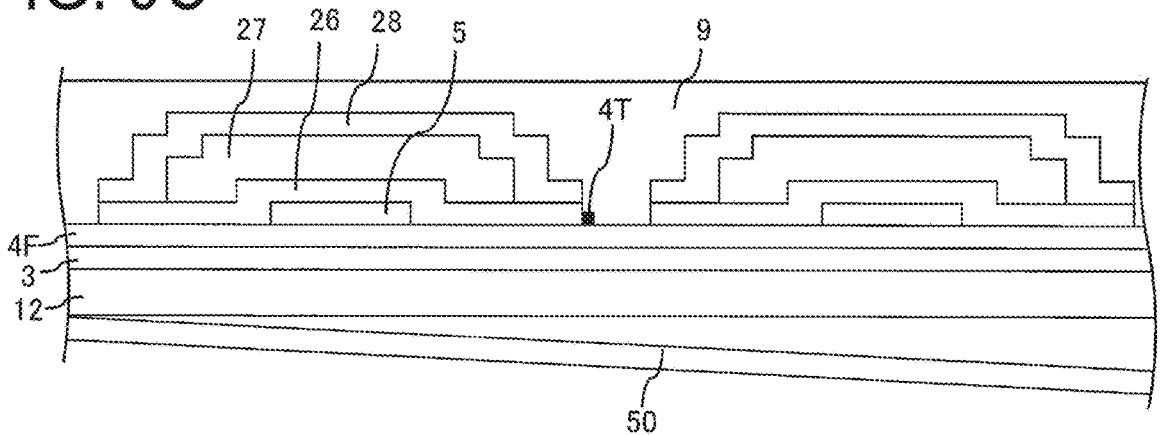
Figure 10:
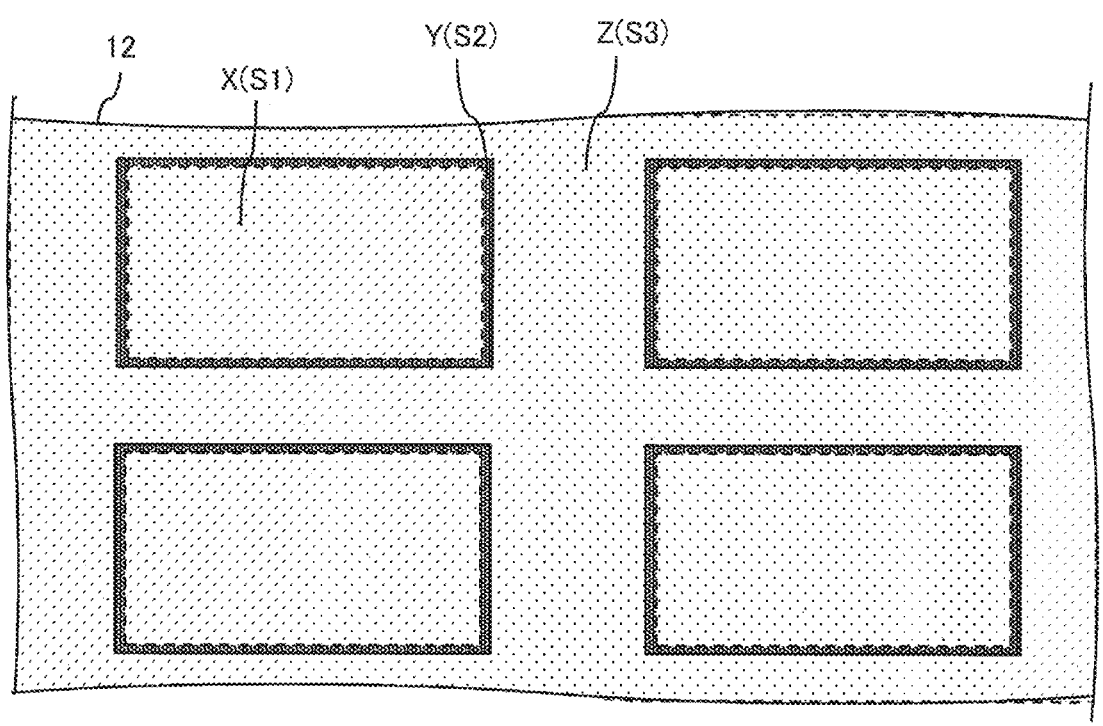
FIG. 10 is a plan view illustrating an intensity of a laser beam for each region according to the third embodiment.

FIGS. 9A to 9C are schematic views illustrating irradiation of laser and peeling of a glass substrate according to a third embodiment, and FIG. 10 is a plan view illustrating an intensity of a laser beam for each region according to the third embodiment.

In the third embodiment, as illustrated in FIGS. 9A, 10, a region X of a resin layer 12 (region in which the resin layer 12 overlaps with the organic sealing film 27, the inorganic insulating film 4F of the TFT layer 4, the first inorganic sealing film 26, and the second inorganic sealing film 28) is set as a first region to be irradiated with a laser beam at an intensity S1; a region Y of the resin layer 12 (region in which the resin layer 12 and the organic sealing film 27 do not overlap with each other, but the resin layer 12 overlaps with the inorganic insulating film 4F of the TFT layer 4, the first inorganic sealing film 26 and the second inorganic sealing film 28) is set as a second region to be irradiated with a laser beam at an intensity S2; and a region Z of the resin layer 12 (region in which the resin layer 12 does not overlap with the organic sealing film 27, the first inorganic sealing film 26 and the second inorganic sealing film 28, but the resin layer 12 and the inorganic insulating film 4F of the TFT layer 4 overlap with each other) is set as the first region to be irradiated with a laser beam at the intensity S1. Here, a relationship of the intensity S1<the intensity S2 holds.

Thus, as illustrated in FIG. 9B, after irradiation with the laser beam, stress does not change (0→0) in the region X of the resin layer 12; a large tensile stress (+) is generated by the laser beam at the intensity S2 in the region Y of the resin layer 12; and stress does not change (0→0) in the region Z of the resin layer 12. Therefore, compressive stress (−) in the inorganic insulating film 4F, the first inorganic sealing film 26 and the second inorganic sealing film 28 released at the time of peeling of a glass substrate 50 illustrated in FIG. 9C is negated by the tensile stress (+) in the region Y of the resin layer 12, and wrinkles or curls that may be generated in a layered body 7 can be reduced. Note that laser abrasion marks may be formed in at least a portion of the region Y of the resin layer 12 (described below).

Note that in FIG. 10, the region Y of the resin layer 12 is entirely set as the second region to be irradiated with a laser beam at the intensity S2, but the embodiment is not limited to this case. As illustrated in FIG. 8A, an inner region Ya of the region Y can be irradiated with a laser beam at the intensity S1, and an outer region Yb of the region Y can be irradiated with a laser beam at the intensity S2. Moreover, as illustrated in FIG. 8B, a central region Yc of the region Y can be irradiated with a laser beam at the intensity S2, and other regions (regions on both sides of the central region Yc) Yg can be irradiated with a laser beam at the intensity S1.

Regarding First to Third Embodiments

Figure 11A:
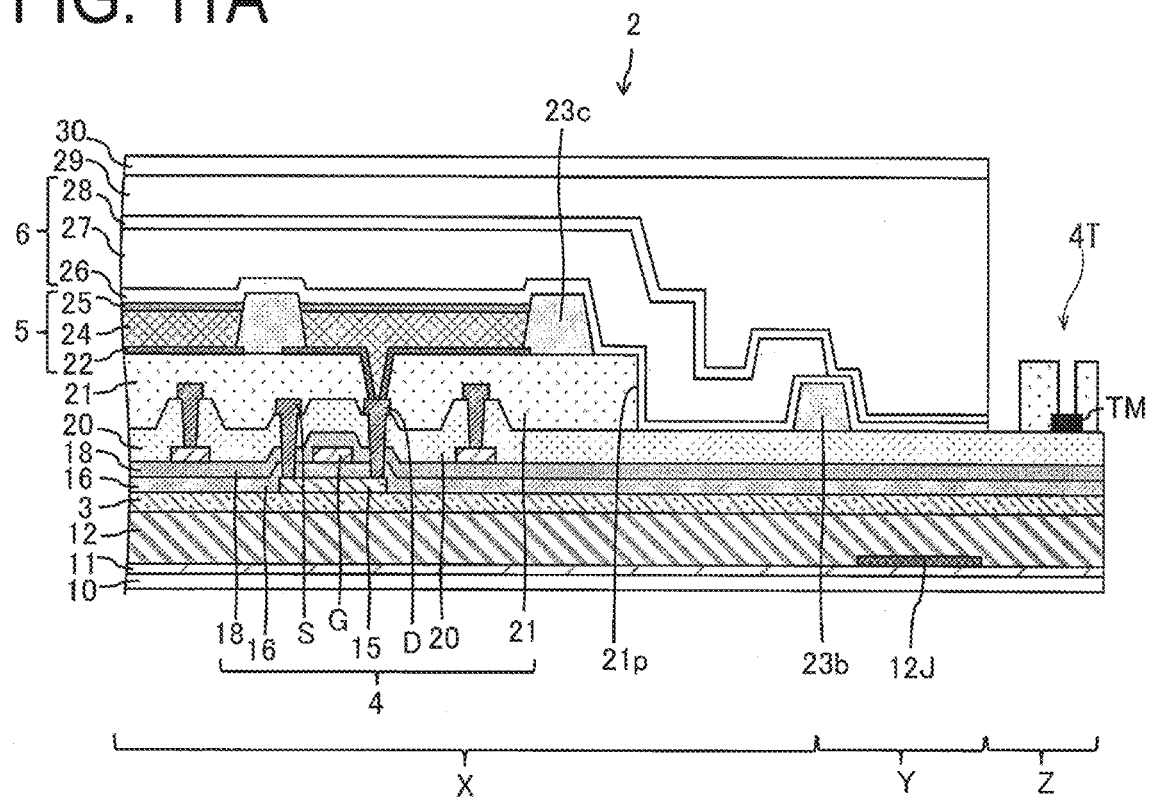
FIGS. 11A and 11B are cross-sectional views and FIG. 11C is a plan view illustrating a configuration of an OLED panel obtained according to the embodiments.
Figure 11B:
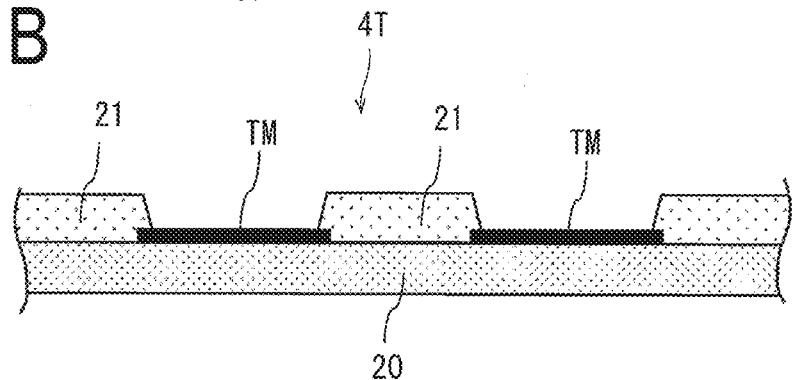

FIG. 11 is a cross-sectional view illustrating a configuration of an OLED panel obtained by the embodiments described above. An OLED panel 2 includes the resin layer 12, the moisture-proof layer 3, the TFT layer 4 including the inorganic insulating films 16, 18, 20, the OLED layer 5, and the sealing layer 6 including the organic sealing film 27, the first inorganic sealing film 26 and the second inorganic sealing film 28. In the OLED panel 2, the lower face film 10 is attached to the lower face of the resin layer 12 via an adhesive layer 11 and a functional film 30 is attached to an upper face of the sealing layer 6 via an adhesive layer 29, and the OLED panel 2 has flexibility. The functional film 30 is attached after peeling of the upper face film (see S10 in FIG. 1), and may have at least one of a protection function, an optical compensation function and a touch sensor function.

For example, according to the second and third embodiments, as illustrated in FIG. 11A, the region X of the resin layer 12 (region in which the resin layer 12 overlaps with the organic sealing film 27, the inorganic insulating films 16, 18, 20 of the TFT layer 4, the first inorganic sealing film 26, and the second inorganic sealing film 28) is irradiated with a laser beam at the intensity S1; the region Y of the resin layer 12 (region in which the resin layer 12 and the organic sealing film 27 do not overlap with each other, but the resin layer 12 overlaps with the inorganic insulating films 16, 18, 20 of the TFT layer 4, the first inorganic sealing film 26 and the second inorganic sealing film 28) is irradiated with a laser beam at the intensity S2; and the region Z of the resin layer 12 (region in which the resin layer 12 does not overlap with the organic sealing film 27, the first inorganic sealing film 26 and the second inorganic sealing film 28, but the resin layer 12 and the inorganic insulating films 16, 18, 20 of the TFT layer 4 overlap with each other) is irradiated with a laser beam at the intensity S3.

Figure 11C:
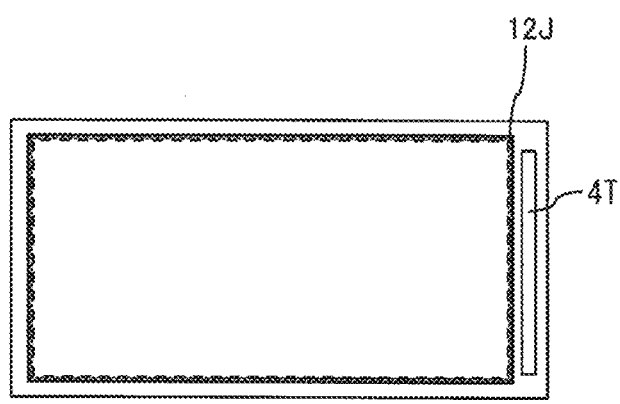

Then, since the relationship of the intensity S1<the intensity S3<the intensity S2 holds, as illustrated in FIGS. 11A, 11C, a recessed portion 12J that is a laser abrasion mark is formed in the region Y of the resin layer 12 (in particular, at an interface with the adhesive layer 11). The recessed portion 12J is generated in the region irradiated with the laser beam at the intensity S2. As a result, when the region Y is entirely irradiated with the laser beam at the intensity S2, the recessed portion 12J is formed in almost entirely the region Y, whereas when only a portion of the region Y (a central portion or an outer portion) is irradiated with the laser beam at the intensity S2, the recessed portion 12J is formed in only a portion of the region Y (the central portion or the outer portion) (see FIG. 8).

The TFT layer 4 includes the terminal part 4T, and the terminal part 4T does not overlap with the organic sealing film 27, the first inorganic sealing film 26 and the second inorganic sealing film 28, but overlaps with the inorganic insulating films 16, 18, 20 of the TFT layer 4. That is, the terminal part 4T overlaps with the region Z of the resin layer 12. The edges of the terminals TM are covered with the inorganic interlayer film 21.

Since there is a tendency for water to penetrate the organic interlayer film 21, the production of the organic interlayer film 21 is preferably stopped temporarily in the region overlapping with the first inorganic sealing film 26 and the second inorganic sealing film 28, and an end face 21p of the region is desirably covered with the first inorganic sealing film 26 and the second inorganic sealing film 28.

Supplement

According to a first aspect, a production method for an OLED panel includes: forming on an upper face side of a transparent substrate, a layered body including a resin layer, a TFT layer, an OLED layer and a sealing layer including an organic sealing film; and then irradiating the resin layer being in contact with the transparent substrate with a laser beam to separate the transparent substrate and the layered body. In the production method, the resin layer includes a first region to be irradiated with a laser beam at a first intensity and a second region to be irradiated with a laser beam at a second intensity greater than the first intensity, the first region overlaps with the organic sealing film, and the second region does not overlap with the organic sealing film.

In a second aspect, the sealing layer includes an inorganic sealing film, the TFT layer includes an inorganic insulating film, the first region overlaps with the inorganic sealing film and the inorganic insulating film, and the second region overlaps with the inorganic insulating film.

In a third aspect, when the layered body is formed, the organic sealing film has tensile stress, and the inorganic sealing film and the inorganic insulating film have compressive stress.

In a fourth aspect, tensile stress is generated in the second region of the resin layer by irradiating the resin layer with a laser beam at the second intensity.

In a fifth aspect, the second region overlaps with the inorganic sealing film.

In a sixth aspect, the resin layer includes a third region to be irradiated with a laser beam at a third intensity, a relationship of the first intensity≤the third intensity<the second intensity holds, and the third region does not overlap with the organic sealing film and the inorganic sealing film, but overlaps with the inorganic insulating film.

In a seventh aspect, the resin layer includes a third region to be irradiated with a laser beam at a third intensity, the first intensity and the third intensity are equal (substantially equal), a relationship of the third intensity<the second intensity holds, and the third region does not overlap with the organic sealing film and the inorganic sealing film, but overlaps with the inorganic insulating film.

In an eighth aspect, the TFT layer includes a plurality of terminals overlapping with the third region.

In a ninth aspect, the TFT layer includes an organic interlayer film disposed on an OLED layer side, and edges of each terminal are covered with the organic interlayer film.

In a tenth aspect, the first region overlaps with the organic interlayer film.

In an eleventh aspect, when the layered body is formed, the organic interlayer film has tensile stress.

In a twelfth aspect, the second intensity is from 1.2 to 2.2 times the first intensity.

In a thirteenth aspect, the first region corresponds to a display part of one panel, and the second region surrounds the first region.

In a fourteenth aspect, a film is attached to an upper face of the sealing layer after the formation of the layered body.

In a fifteenth aspect, a flexible base material is attached to a lower face of the resin layer after the separation of the transparent substrate and the layered body.

In a sixteenth aspect, the organic sealing film is formed by curing an applied resin.

In a seventeenth aspect, the inorganic sealing film and the inorganic insulating film are each formed by a CVD.

In an eighteenth aspect, the resin layer is formed with polyimide.

According to a nineteenth aspect, an OLED panel includes on an upper face side of a flexible base material, a layered body including a resin layer, a TFT layer including an inorganic insulating film, an OLED layer and a sealing layer including an inorganic sealing film and an organic sealing film. In the OLED panel, the resin layer includes a first region overlapping with the inorganic sealing film, the inorganic insulating film and the organic sealing film, and a second region overlapping with the inorganic sealing film and the inorganic insulating film but not overlapping with the organic sealing film, and a recessed portion is formed in at least a portion of the second region.

In a twentieth aspect, the organic sealing film is formed with a photosensitive organic resin material.

In a twenty-first aspect, end portions of the organic sealing film are covered with the inorganic sealing film.

In a twenty-second aspect, the resin layer includes a third region not overlapping with the organic sealing film and the inorganic sealing film but overlapping with the inorganic insulating film, and the TFT layer includes a plurality of terminals overlapping with the third region.

In a twenty-third aspect, the TFT layer includes an organic interlayer film disposed on an OLED layer side, and edges of each terminal are covered with the organic interlayer film.

In a twenty-fourth aspect, the first region corresponds to a display part of one panel, and the second region surrounds the first region.

In a twenty-fifth aspect, the recessed portion is an abrasion mark.

According to a twenty-sixth aspect, a production apparatus for an OLED panel forms on an upper face side of a transparent substrate, a layered body including a resin layer, a TFT layer, an OLED layer and a sealing layer including an organic sealing film, and then irradiates the resin layer being in contact with the transparent substrate with a laser beam to separate the transparent substrate and the layered body. In the production apparatus, the resin layer includes a first region to be irradiated with a laser beam at a first intensity and a second region to be irradiated with a laser beam at a second intensity greater than the first intensity, the first region overlaps with the organic sealing film, and the second region does not overlap with the organic sealing film.

The disclosure is not limited to the embodiments described above, and embodiments obtained by appropriately combining the technical approaches disclosed in each of the different embodiments also fall within the technical scope of the disclosure. Further, novel technical features can be formed by combining the technical approaches disclosed in each of the embodiments.

REFERENCE SIGNS LIST

2 OLED panel
4 TFT layer
5 OLED layer
6 Sealing layer
7 Layered body
10 Lower face film 12 Resin layer
12J Recessed portion (laser abrasion mark)
16 Inorganic insulating film
18 Inorganic insulating film
20 Inorganic insulating film
21 Organic interlayer film
26 First inorganic sealing film
27 Organic sealing film
28 Second inorganic sealing film
50 Glass substrate
4T Terminal part
TM Terminal

What is claimed is:

1. An OLED panel comprising:
on an upper surface side of a flexible base material, a laminate including:
a resin layer;
a TFT layer including an inorganic insulating film;
an OLED layer; and
a sealing layer including an inorganic sealing film and an organic sealing film, wherein
the resin layer includes a first region overlapping with the inorganic sealing film, the inorganic insulating film and the organic sealing film, and a second region overlapping with the inorganic sealing film and the inorganic insulating film, but not overlapping with the organic sealing film,
a recessed portion is provided in at least a portion of the second region, and
the recessed portion is provided in a surface of the resin layer on a flexible base material side of the resin layer.

2. The OLED panel according to claim 1, wherein the organic sealing film is made of a photosensitive organic resin material.

3. The OLED panel according to claim 1, wherein end portions of the organic sealing film are covered with the inorganic sealing film.

4. The OLED panel according to claim 1, wherein
the resin layer includes a third region not overlapping with the organic sealing film and the inorganic sealing film, but overlapping with the inorganic insulating film, and
the TFT layer includes a plurality of terminals overlapping with the third region.

5. The OLED panel according to claim 4, wherein
the TFT layer includes an organic interlayer film disposed on an OLED layer side, and
edges of each of the plurality of terminals are covered with the organic interlayer film.

6. The OLED panel according to claim 1, wherein the first region corresponds to a display portion, and the second region surrounds the first region.

7. The OLED panel according to claim 1, wherein the recessed portion includes an abrasion mark.

8. The OLED panel according to claim 1, wherein the recessed portion surrounds the first region.

9. The OLED panel according to claim 1, further comprising an adhesive layer in contact with the surface of the resin layer in which the recessed portion is provided.

10. The OLED panel according to claim 9, wherein the adhesive layer attaches the surface of the resin layer in which the recessed portion is provided to the flexible base material.

* * * * *